United States Patent
Chen

(10) Patent No.: US 6,515,512 B2
(45) Date of Patent: Feb. 4, 2003

(54) CAPACITIVELY COUPLED RE-REFERENCING CIRCUIT WITH TRANSIENT CORRECTION

(75) Inventor: Jiann-Neng Chen, Weston, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/040,124

(22) Filed: Jan. 4, 2002

(65) Prior Publication Data

US 2002/0057107 A1 May 16, 2002

Related U.S. Application Data

(63) Continuation-in-part of application No. 09/468,146, filed on Dec. 21, 1999.

(51) Int. Cl.[7] .................. H03K 19/0175; H03K 19/003
(52) U.S. Cl. ............................. 326/62; 326/82; 326/22
(58) Field of Search ............... 326/62–63, 74, 326/77, 78, 82, 22, 26, 29–31

(56) References Cited

U.S. PATENT DOCUMENTS 4,255,712 A * 3/1981 Petrie .......................... 327/167
4,794,283 A * 12/1988 Allen et al. ..................... 326/27
5,414,354 A * 5/1995 Bushman et al. ........... 327/104
6,031,404 A * 2/2000 Roither et al. ............... 327/184

FOREIGN PATENT DOCUMENTS

JP                02241355 A * 9/1990 ............ H02M/3/07

* cited by examiner

Primary Examiner—Michael Tokar
Assistant Examiner—James H. Cho
(74) Attorney, Agent, or Firm—Bruce D. Rubenstein

(57) ABSTRACT

A re-referencing circuit for re-referencing a digital input signal from a first logic environment to a second logic environment includes a non-inverting circuit having a non-inverting transfer characteristic between the input and the output. A capacitive element has a first node coupled to the input of the non-inverting circuit and a second node arranged to receive the digital input signal. A resistive element is coupled between the input and the output of the non-inverting circuit. The re-referencing circuit further includes a transient correcting circuit having a first input coupled to a substantially DC level of the first logic environment, a second input coupled to a substantially DC level of the second logic environment, and an output coupled to the input of the non-inverting circuit. The transient correcting circuit applies transient DC differences between the two environments to cancel the effects of transients in the digital input signal.

20 Claims, 2 Drawing Sheets

CAPACITIVELY COUPLED RE-REFERENCING CIRCUIT WITH TRANSIENT CORRECTION

CROSS-REFERENCES TO RELATED APPLICATIONS

This application is a continuation-in-part of prior U.S. application Ser. No. 09/468,146, entitled "Capacitively Coupled Re-Referencing Circuit with Positive Feedback," filed Dec. 21, 1999, which is hereby incorporated by reference.

FIELD OF THE INVENTION

This invention relates generally to signal re-referencing, and more particularly to logic level re-referencing for digital signals in automatic test systems.

BACKGROUND OF THE INVENTION

Communicating among different portions of a test system customarily involves the use of level translators to re-reference digital signals. FIG. 1 illustrates a conventional technique for conveying digital signals between a first portion 110 and a second portion 112 of a test system. The first and second circuit portions 110, 112 may be physically distant from each other, or they may operate from different power supplies or grounds. Level translators 122 and 124 are connected between the first and second circuit portions 110 and 112. Each level translator receives an input signal from one circuit portion (e.g., from driver 114 or driver 120) and provides a re-referenced output signal to the other circuit portion (e.g., to receiver 116 or 118). Each level translator 122, 124 also receives power and ground from both of the circuits portions 110 and 112.

The purpose of a level translator is to transform an input signal having one set of logic levels into an output signal having another set of logic levels. For example, assume that a digital signal is to be conveyed from TTL logic levels to ECL logic levels. As is known, TTL logic generally uses +5 v and ground for powering digital logic, and ECL logic generally uses ground and −5.2 v. Logic high and low levels are approximately 4 v and 1 v, respectively, for TTL, but are approximately −0.8 v and −1.8 v for ECL. To convey logic signals from TTL to ECL, a level translator respectively transforms high and low logic signals on the TTL side into high and low logic signals on the ECL side.

By applying level translators 122, 124 to the system of FIG. 1, the different portions 110 and 112 of the test system can communicate with each other. They communicate, however, at the expense of increased component count and increased complexity.

When conveying large numbers of signals, such as data or address busses, level translators constitute a significant portion of an overall system design. Level translators take up space that could otherwise be used for performing more substantive operations. They also consume power and cost money. In addition, when level translators are used to transmit signals that have precise timing relationships to one another, it becomes difficult to maintain equal path delays among the different signals. Circuit board layout becomes particularly complicated.

To overcome the expense and complexity of providing separate level translators, many circuit designs have incorporated level translators within integrated circuits. The level translators then reside within the same physical packages that house the devices that receive the level-translated signals. But because conventional level translators require power and ground connections from both of the circuit portions to which they connect (e.g., circuit portions 110 and 112), the number of power and ground leads that must be provided on the integrated circuit packages grows considerably. The proliferation of power and ground leads reduces the number of leads that are available for conveying other signals, potentially limiting the functional capabilities of the integrated circuits.

What is needed is a way of conveying digital logic signals with less complexity. In particular, what is needed is a way of conveying digital logic between different portions of a system without having to convey as many power and ground connections as are required using current techniques.

SUMMARY OF THE INVENTION

With the foregoing background in mind, it is an object of the invention to convey digital logic between different portions of a system or between different logic families.

To achieve the foregoing objects and other objectives and advantages, a logic level re-referencing circuit for re-referencing a digital input signal from a first logic environment to a second logic environment includes a non-inverting circuit having an input and an output, and a non-inverting transfer characteristic between the input and the output. The logic level re-referencing circuit includes a capacitive element having a first node coupled to the input of the non-inverting circuit and a second node arranged to receive the digital input signal. A resistive element is coupled between the input and the output of the non-inverting circuit. Rising and falling edges of the digital input signal couple through the capacitive element to the input of the non-inverting circuit, where they activate the non-inverting circuit to respectively assume high and low digital logic states. Output states are maintained by feedback through the resistive element. To correct for transients between the DC levels of the first and second logic environments, the re-referencing circuit includes a transient correcting circuit. The transient correcting circuit has a first input coupled to a substantially DC level of the first logic environment, a second input coupled to a substantially DC level of the second logic environment, and an output coupled to the input of the non-inverting circuit. The transient correcting circuit applies transient differences between the two environments to cancel the effects of transients in the digital input signal.

BRIEF DESCRIPTION OF THE DRAWINGS

The invention will be better understood with reference to the accompanying drawings, in which aspects of the prior art and the invention are illustrated as follows:

FIG. 2b is a timing diagram of waveforms that can be observed in the re-referencing circuit of FIG. 2a.

DESCRIPTION OF THE PREFERRED EMBODIMENT

Figure 1:
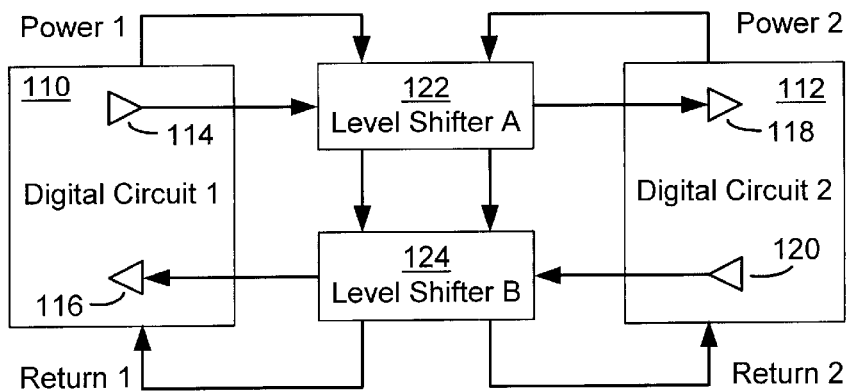
FIG. 1 is a block diagram of a system in which logic levels are translated between two different portions of a digital system, or between two different families of digital logic, according to conventional techniques.
Figure 2A:
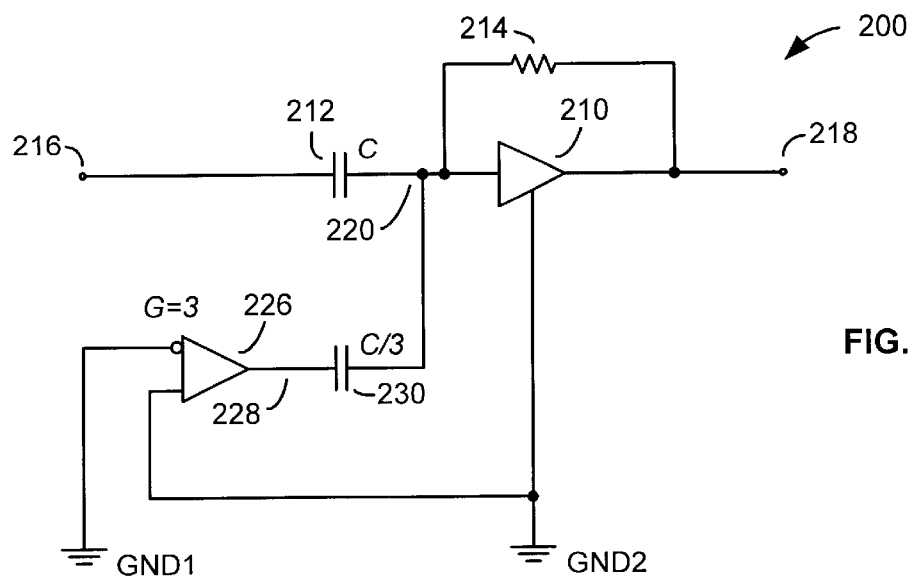
FIG. 2a is a simplified schematic of an embodiment of a re-referencing circuit according to the invention.

FIG. 2a illustrates a re-referencing circuit 200 according to the invention, having an input 216 node and an output 218 node. The re-referencing circuit 200 includes a non-inverting circuit 210. A first capacitive element 212 is coupled between the input node 216 of the re-referencing circuit 200 and an input node 220 of the non-inverting circuit 210. The re-referencing circuit further includes a resistive element 214 coupled between the input node 220 of the non-inverting circuit 210 and the output 218 node of the re-referencing circuit 200.

The re-referencing circuit 200 operates in response to an input signal applied to the input node 216. The input signal has high and low voltage levels established by a source circuit (not shown) from which the input signal originates. The re-referencing circuit 200 translates digital highs and lows referenced to a first logic environment (that of the source circuit) to corresponding digital highs and lows referenced to a second logic environment (that of the re-referencing circuit). The first and second logic environments may correspond to different logic families (e.g., HCMOS and ECL), different physical locations, or both. Alternatively, the first and second logic environments may be the same.

Figure 2B:
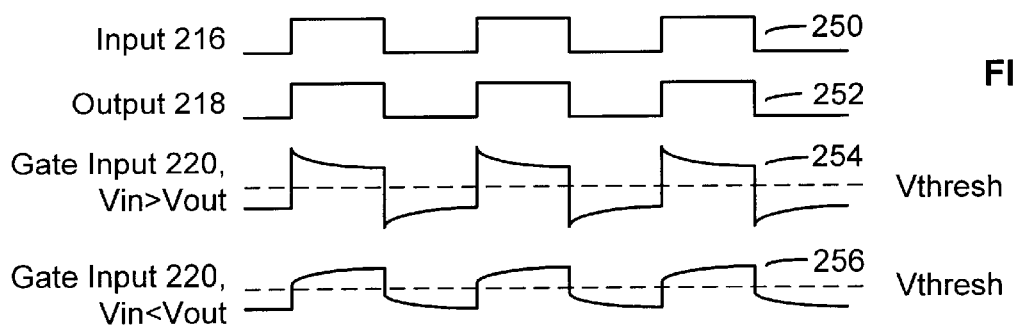

FIG. 2b illustrates input and output signals 250 and 252 of the re-referencing circuit 200, as well as examples (254, 256) of signals that may appear at the input 220 of the non-inverting circuit 210. Upon the occurrence of a rising edge of the input signal 250, the edge capacitively couples through the first capacitive element 212 and appears at the input 220 of the non-inverting circuit 210. If the capacitively coupled rising edge at the input 220 crosses a high threshold of the non-inverting circuit 210, the non-inverting circuit 210 assumes a high output state.

When the output signal 252 goes high, a current is fed back through the resistive element 214 to the input 220 of the non-inverting circuit 210. The current from the output 218 tends to drive the input 220 of the non-inverting circuit 210 to the same voltage as the output 218 of the non-inverting circuit 210. With the input and output of the non-inverting circuit having substantially equal voltages, the logic re-referencing circuit maintains a stable state, even if the input signal 250 is disconnected.

Upon the occurrence of a falling edge of the input signal 250, a similar sequence of events takes place, although with opposite polarity. The falling edge capacitively couples through the first capacitive element 212 and appears at the input 220 of the non-inverting circuit 210. If the capacitively coupled falling edge crosses a low threshold of the non-inverting circuit 210, the non-inverting circuit 210 assumes a low output state. Current feeds back through the resistive element 214, tending to drive the input 220 of the non-inverting circuit to a voltage that substantially equals the voltage at the output. A stable state is established, and that state is maintained until the logic re-referencing circuit 200 subsequently responds to a rising edge on the input signal 250. The stable state is maintained, even if the input signal is disconnected.

The input and output signals 250 and 252 appear to have equal voltage swings. The voltage swings of the input and output signals need not be the same, however. If the voltage swing of the input signal 250 is greater than the voltage swing of the output signal 252, the voltage at the input 220 of the non-inverting circuit 210 may appear like the signal 254. Positive edges of the input signal 250 cause the signal 254 to exceed the highest level of the output signal 252. Likewise, falling edges of the input signal 250 cause the signal 254 to exceed, in the negative direction, the lowest level of the output signal 252. After each transition, the signal 254 tends to return to the voltage of the output signal 252, as feedback through the resistive element 214 tends to equalize the input and output voltages of the non-inverting circuit 210.

If, however, the voltage swing of the input signal 250 is less than the voltage swing of the output signal 252, the voltage at the input 220 of the non-inverting circuit 210 may appear like the signal 256. Positive edges of the input signal 250 cause the signal 256 to rise to a value lower than the highest level of the output signal 252. Falling edges of the input signal 250 cause the signal 256 fall to a value higher than the lowest level of the output signal 252. Over time, feedback tends to cause the signal 256 to return to the voltage of the output signal 252.

The threshold level, or levels, of the non-inverting circuit 210 significantly affect the operation of the logic re-referencing circuit 200. For example, if the non-inverting circuit 210 has a single threshold for high low transitions, the capacitively coupled input signal (e.g., waveforms 254, 256) must cross that threshold to induce both high and low logic states. If the high and low thresholds are different, the non-inverting circuit 210 only goes high in response to rising edges crossing the high threshold, and only goes low in response to falling edges crossing the low threshold level.

The DC voltage levels of the input signal 250 relative to the output signal 252 are substantially irrelevant to the operation of the re-referencing circuit 200. DC voltage levels of the input signal 250 are not applied to the non-inverting circuit 210, but rather are maintained across the first capacitive element 212. Thus, the logic re-referencing circuit 200 behaves substantially the same way for input signals that vary between 0 and 5 v as it does for those that vary between 10 and 15 v, or between −10 and −5 v.

Although the DC level of the input signal 250 does not affect the performance of the re-referencing circuit 200, transients in the DC level may be mistaken for logic transitions, which may cause the output of the re-referencing circuit to falsely change state. These transients may arise from interference, ground loops, or other sources of noise, which cause the ground or logic references of the first and second logic environments to suddenly change in relation to each other.

To correct for these transient effects, the re-referencing circuit 200 includes a transient correction circuit 226. The transient correcting circuit 226 has a first input coupled to a substantially DC level of the source circuit (e.g., GND1) and a second input coupled to a substantially DC level of the re-referencing circuit (e.g., GND2). The transient correcting circuit 226 generates an output signal 228 proportional to the difference between these levels. Transients in this difference signal correspond to transients between the DC levels of first and second logic environments.

Preferably, the output signal 228 of the correction circuit 226 is capacitively coupled to the input of the non-inverting circuit 210 via a second capacitive element 230, to directly cancel errors injected via the input signal. Whenever the input signal undergoes a transient as seen from the re-referencing circuit 200, it injects an error current into the input 220 of the non-inverting circuit 210. In response to the same transient, however, the transient correcting circuit 226 injects a substantially equal and opposite current, which cancels the error current and leaves the input 220 of the non-inverting circuit substantially undisturbed by the transient. False switching of the non-inverting circuit 210 is therefore averted.

The capacitance of the second capacitive element 230 is preferably made small in relation to that of the first capacitive element 212, to minimize attenuation of the input signal. To ensure that transient errors are canceled one-for-one from the input signal, the transient correcting circuit 226 has a gain that substantially equals the ratio of capacitance of the first capacitive element 212 to the second capacitive element 230. Increasing the gain of the circuit 226 tends to reduce its bandwidth, however, which impairs its ability to correct errors. It also requires that the circuit produce larger voltage swings. We have found that a capacitance ratio of 3:1 (and therefore a gain of 3) provides an effective balance between these factors. The optimal capacitance ratio in any given application will vary, however, depending upon how the re-referencing circuit is used, as well as the speed of the amplifier used to realize the correcting circuit 226. Therefore, the capacitance ratio is not limited to any particular value, but rather is a matter of design choice.

In the preferred embodiment, the entire re-referencing circuit 200 is incorporated within the integrated circuit that uses the re-referenced signal. This is not required, however. Alternatively, the re-referencing circuit 200 can be made of discrete components, as a matter of design choice.

The non-inverting circuit 210 can be implemented in either analog or digital form. When implemented in digital form, the non-inverting circuit 210 may constitute a single logic gate. A buffer can be used, an OR gate, an AND gate, or any other gate having a non-inverting transfer characteristic between an input and an output. If a logic gate has one or more unused inputs, the unused inputs should be connected in a manner that enables non-inverting operation of the logic gate between the input and the output. The gain of the non-inverting circuit 210 is preferably greater high, to ensure that the output signal 252 can reach sufficient levels to meet input requirements of any downstream components.

The transient correcting circuit 226 is preferably a differential amplifier, such as an operational amplifier circuit, integrated within an integrated circuit along with other components of the re-referencing circuit. Differential amplifiers can be fabricated within integrated circuits using a variety of semiconductor processes. One such process employs CMOS gates to realize differential amplifiers of prescribed gain. Using this process, the transient correcting circuit 226 can be conveniently incorporated within the same digital integrated circuit that uses the re-referenced signal. The transient correcting circuit 226 can also be realized using a conventional operational amplifier (op amp). The op amp can be configured with its non-inverting input connected to GND2 and its inverting input connected, through an input resistor $R_{IN}$, to GND1. A feedback resistor $R_F$ between the output and the inverting input of the op amp provides a fixed gain $-R_F/R_{IN}$. Again, the particular form of the correction circuit 226 is a matter of design choice and is not critical to the invention.

Figure 3:
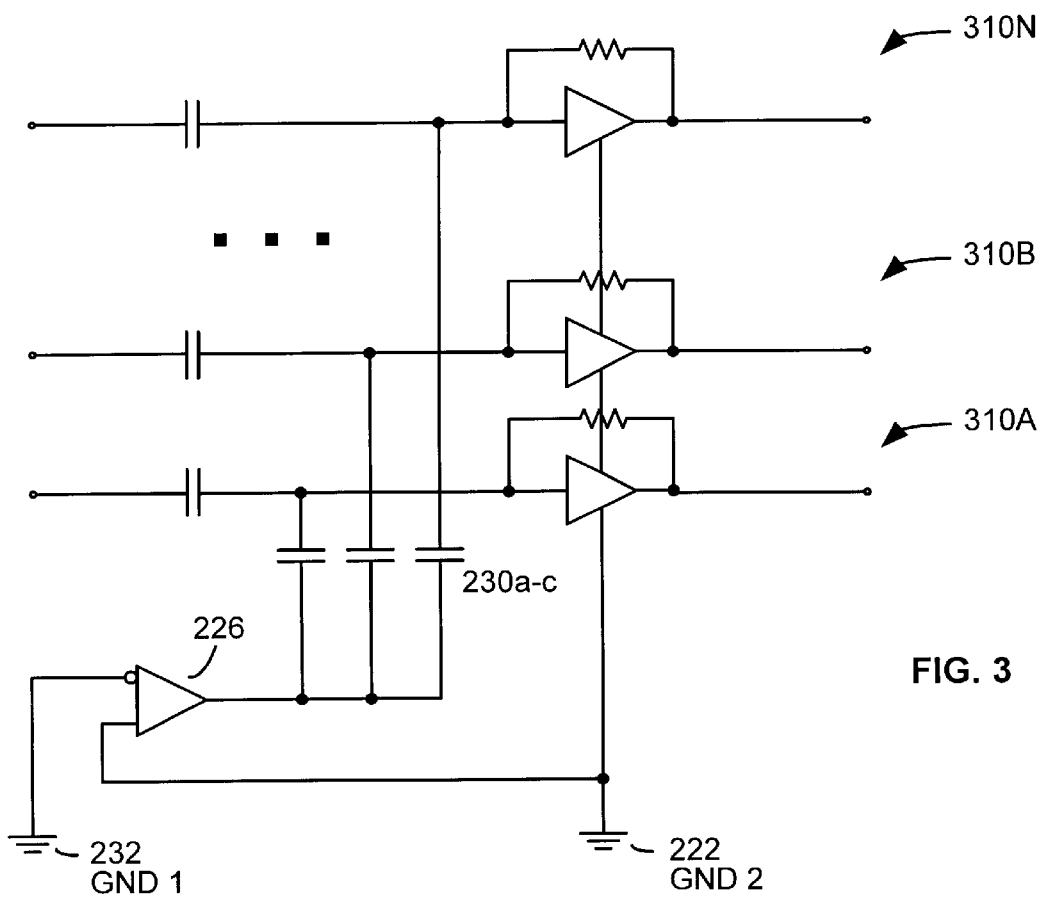
FIG. 3 is a simplified schematic of a system in which logic levels are translated between different portions of the system, or between different families of digital logic, using a plurality of re-referencing circuits according to the invention.

Preferably, a single transient correcting circuit 226 is used for correcting errors for a number of input signals. As shown in FIG. 3, one transient correcting circuit 226 corrects the errors for N input signals. Depending upon the drive capability of the amplifier used to realize the transient correcting circuit 226 and the number of inputs supplied to the device, a single correcting circuit may be adequate to correct input signals for the entire device. A digital interface constructed using re-referencing circuits 200 thus requires only N+1 inputs for translating N different signals (the N signals plus GND1).

Having described one embodiment, numerous alternative embodiments or variations can be made. For example, the re-referencing circuit 200 has been described for use with signals from distant portions of a system or from different logic families. The re-referencing circuit 200 is not limited, however, to these applications. Rather, it can be used for receiving all digital input signals of a circuit, regardless of whether the signals need to be re-referenced. Thus, the re-referencing circuit 200 can be a default digital receiver, able to accept a wide range of input signals. Integrated circuits can be constructed using the re-referencing circuit 200 as a default input receiver for receiving all digital input signals.

As described herein, the transient correcting circuit 226 employs GND1 and GND2 from the first and second logic environments for generating a transient correcting signal. These are merely examples, however, of voltages that can be used. Any substantially DC level that tracks the respective environment's power and/or ground level can be used. For instance, power supplies (e.g., VCC, VEE, etc.) or any voltage strongly bypassed to a local ground or power supply can be used. As a variation on this alternative, the inputs of the transient correction circuit 226 can themselves be AC-coupled to DC levels of the respective environments, provided that the time constants of the AC-coupling circuitry is much longer than duration of any transients for which correction is sought.

As described above, the capacitive elements 212 and 230 and the transient correcting circuit 226 are preferably fabricated within an integrated circuit along with the rest of the circuitry that constitutes the re-referencing circuit. Alternatively, however, these elements can be positioned near the source circuit, which originates the input signal 250, or at any other convenient location.

It should be understood, therefore, that the invention may be practiced in a variety of different ways, and should be limited only by the spirit and scope of the appended claims.

What is claimed is:

1. A logic level re-referencing circuit, comprising:
   a digital input for receiving a digital input signal having logic levels referenced to a first logic environment;
   a non-inverting circuit referenced to a second logic environment and having an input, an output, and a non-inverting transfer characteristic between the input and the output;
   a capacitive element having a first node coupled to the input of the non-inverting circuit and a second node coupled to the digital input;
   a resistive element coupled between the input of the non-inverting circuit and the output of the non-inverting circuit; and
   a transient correcting circuit having a first input coupled to the first logic environment, a second input coupled to the second logic environment, and an output coupled to the input of the non-inverting circuit for substantially reducing a transient error between the first and second logic environments,
   wherein the logic level re-referencing circuit is constructed and arranged to respectively produce high and low logic levels referenced to the second logic environment in response to high and low logic levels referenced to the first logic environment.

2. The logic level re-referencing circuit of claim 1, manufactured within an integrated circuit.

3. The logic level re-referencing circuit of claim 1, wherein the capacitive element comprises a capacitor integrated within an integrated circuit.

4. The logic level re-referencing circuit of claim 1, wherein the resistive element comprises a resistor integrated within an integrated circuit.

5. The logic level re-referencing circuit of claim 1, wherein the non-inverting circuit is a commercially available non-inverting circuit, to which the resistive element and the capacitive element are attached to form the logic level re-referencing circuit.

6. The logic level re-referencing circuit of claim 1, wherein the transient correcting circuit generates an output signal proportional to a difference between the signals at the first and second inputs of the transient correcting circuit.

7. The logic level re-referencing circuit of claim 6, wherein the capacitive element is a first capacitive element, and further comprising a second capacitive element having a first node coupled to the output of the transient correcting circuit and a second node coupled to the input of the non-inverting circuit.

8. The logic level re-referencing circuit of claim 7, wherein the transient correcting circuit has a gain that substantially equals the ratio of the capacitance of the first capacitive element to the capacitance of the second capacitive element.

9. The logic level re-referencing circuit of claim 7, wherein the first input of the transient correcting circuit is coupled to a substantially DC level of the first circuit environment, and the second input of the transient correcting circuit is coupled to a substantially DC level of the second circuit environment.

10. The logic level re-referencing circuit of claim 9, wherein the substantially DC level of the first circuit environment is a ground of the first circuit environment, and the substantially DC level of the second circuit environment is a ground of the second circuit environment.

11. A method for re-referencing a digital signal, comprising:

receiving a digital signal having logic levels referenced to a first logic environment;

capacitively coupling rising and falling edges of the digital signal to an input of a non-inverting circuit referenced to a second logic environment;

resistively coupling the output of the non-inverting circuit to the input of the non-inverting circuit to tend to maintain the input of the non-inverting circuit at a substantially same level as the output; and applying a transient correcting signal to the input of the non-inverting circuit for substantially canceling a transient error between the first logic environment and the second logic environment.

12. The method as recited in claim 11, further comprising generating the transient correcting signal.

13. The method as recited in claim 12, wherein the step of generating comprises an amplifier subtracting a substantially DC level in one of the first and second logic environments from a substantially DC level in the other of the first and second logic environments.

14. The method as recited in claim 13, wherein the substantially DC levels of the first and second logic environments are grounds of the first and second logic environments.

15. The method as recited in claim 13, wherein the step of applying comprises capacitively coupling the transient correcting signal to the input of the non-inverting circuit.

16. A method for re-referencing a plurality of digital signals from a first logic environment to a second logic environment, comprising:

capacitively coupling the plurality of digital signals to respective inputs of a plurality of non-inverting circuits referenced to the second logic environment;

generating a transient correcting signal indicative of a transient error between the first logic environment and the second logic environment;

applying the transient correcting signal to the input of each of the plurality of non-inverting circuits for substantially canceling the transient error; and for each non-inverting circuit, resistively coupling the output of the non-inverting circuit to the input of the non-inverting circuit to tend to maintain the input of the non-inverting circuit at a substantially same level as the output.

17. The method as recited in claim 16, wherein the step of generating comprises an amplifier subtracting a substantially DC level in one of the first and second logic environments from a substantially DC level in the other of the first and second logic environments.

18. The method as recited in claim 17, wherein the substantially DC levels of the first and second logic environments are grounds of the first and second logic environments.

19. The method as recited in claim 17, wherein the step of applying comprises capacitively coupling the transient correcting signal to the input of each of the plurality of non-inverting circuits.

20. The method as recited in claim 16, wherein the first and second circuit environments are part of an automatic test system, and further comprising testing electronic devices using the automatic test system.

* * * * *